(12) United States Patent
Engl et al.

(10) Patent No.: US 7,106,812 B2
(45) Date of Patent: Sep. 12, 2006

(54) DEVICE FOR THE RECOVERY OF DATA FROM A RECEIVED DATA SIGNAL

(75) Inventors: Bernhard Engl, Miesbach (DE); Peter Gregorius, Munich (DE)

(73) Assignee: Infineon Technologies, AG, (DE)

( * ) Notice: Subject to any disclaimer, the term of this patent is extended or adjusted under 35 U.S.C. 154(b) by 777 days.

(21) Appl. No.: 10/229,867

(22) Filed: Aug. 28, 2002

(65) Prior Publication Data

US 2003/0156662 A1   Aug. 21, 2003

(30) Foreign Application Priority Data

Feb. 21, 2002  (DE)  ................................. 102 07 315

(51) Int. Cl.
   *H03D 1/00*   (2006.01)
   *H03D 3/24*   (2006.01)
(52) U.S. Cl. ...................................... 375/340; 375/376
(58) Field of Classification Search ................ 375/340, 375/376, 373, 354, 327; 327/165
See application file for complete search history.

(56) References Cited

U.S. PATENT DOCUMENTS 6,055,286 A * 4/2000 Wu et al. .................... 375/375

2003/0122600 A1 * 7/2003 Engl et al. .................. 327/165
2003/0123591 A1 * 7/2003 Walker ........................ 375/355

* cited by examiner

*Primary Examiner*—Khai Tran
(74) *Attorney, Agent, or Firm*—David O. Seeley, Esq.; Jeffery M. Lillywhite, Esq.; Holme Roberts & Owen, LLP

(57) ABSTRACT

A CDR circuit arrangement, for example for a transceiver module, features a data recovery unit (4) for the recovery of the data contained in a received signal (DATA) by scanning this received data signal, and a phase evaluation unit for the determination of a suitable phase position for the scanning carried out by the data recovery unit (4). The phase evaluation unit comprises a scanning device (1) for the oversampling of a the received data signal (DATA) in accordance with several different scanning phases (P0–P6), a phase detector device (2) for the evaluation of the scanning values (A0–A6) accordingly prepared by the scanning device (1), in order thereby to derive intermediate signals (UP1–UP3, DN1–DN3), which classify the phase error during the scanning of the data signal by the scanning device (1) in respect of its size and direction of deviation, as well as a filter device (3), in order to subject the intermediate signals (UP1–UP3, DN1–DN3) generated by the phase detector device (2) to a weighted filtering process. In this situation, a setting signal (ΔP) is generated by the filter device (3) for the subsequent regulation and control of the scanning phases (P0–P6) of the scanning device (1).

21 Claims, 4 Drawing Sheets

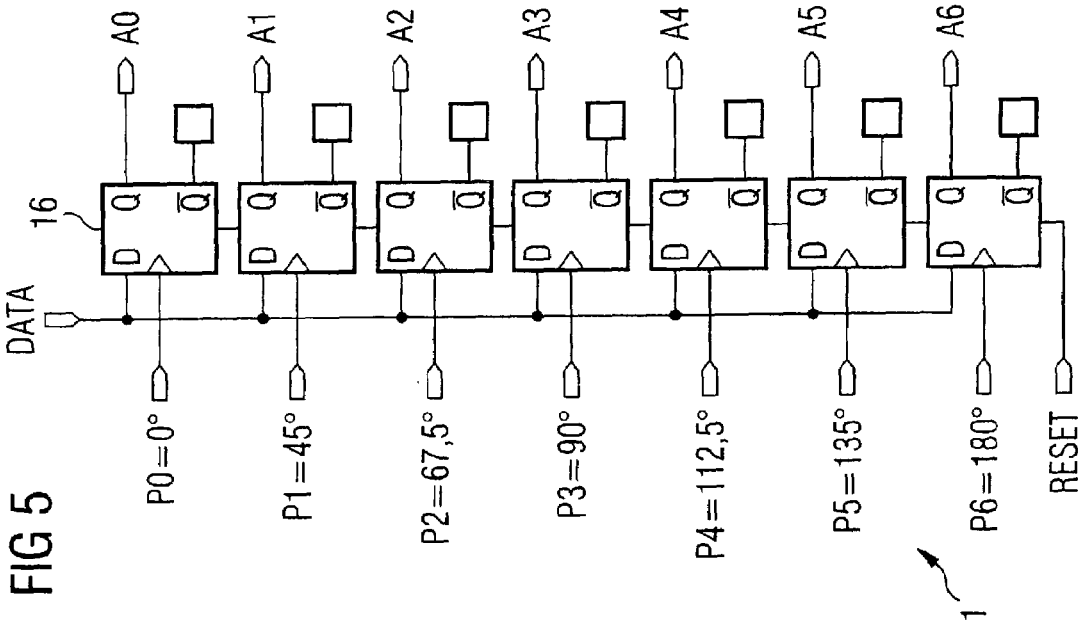
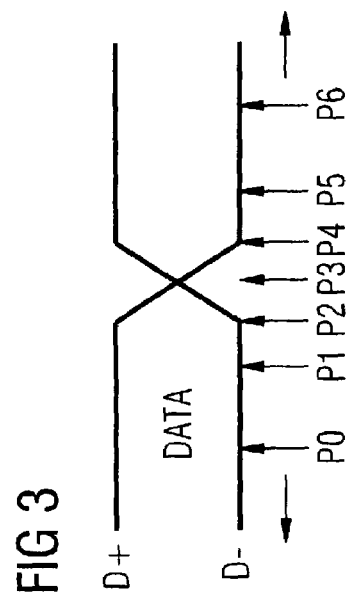
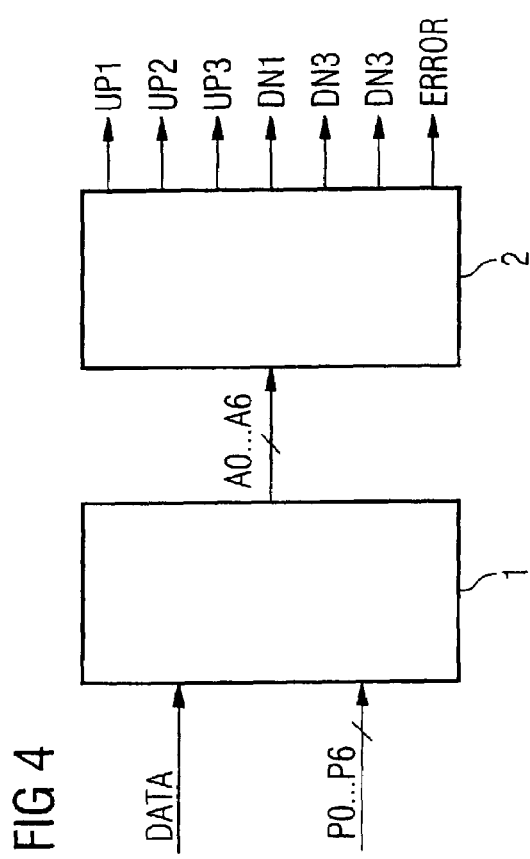

DEVICE FOR THE RECOVERY OF DATA FROM A RECEIVED DATA SIGNAL

CROSS REFERENCE TO RELATED APPLICATIONS

The present application claims priority from German patent application Serial Number DE 102 07 315.5 filed Feb. 21, 2002 and entitled "Device for the Recovery of Data From a Received Data Signal" which application is incorporated herein by reference in its entirety.

BACKGROUND OF THE INVENTION

THE FIELD OF THE INVENTION

The present invention relates to a device for the recovery or reconstruction of data from a received data signal, in order to be able to reconstruct data transferred over a transmission stretch from the data signal. In addition to this, the present invention also relates to a transmission and reception arrangement ("transceiver"), in the reception unit of which a data recovery device of this type can be used.

BRIEF SUMMARY OF THE INVENTION

In rapid data transfer, the demands imposed on transceiver modules with regard to speed, error rate ("Bit Error Rate", BER) and range are steadily increasing. Depending on the channel or transfer medium, data must be transferred in the Gigahertz range, e.g. between 2.488 Gbit/s and 10 Gbit/s (depending on the transmission standard), as error-free as possible. With digital fixed-network data transfer systems, digital data is input in the form of square-wave or trapezoidal pulses into a transmission channel, usually a copper or glass fibre cable, and received at the other end of the cable by a receiver. In this situation the data signal is attenuated with regard to its amplitude as a result of the transmission, as well being distorted with regard to the phase position and the group run time, in which context it may also be superimposed by low-frequency and high-frequency interference.

The task of the circuit arrangements for data recovery in transceiver modules is, therefore, to reconstruct from the data signal received, as precisely as possible, the data which was originally sent, regardless of the interference influences referred to; in other words, the data recovery must also function with data signals which are distorted, inter alia by reflection, crosstalk, inter-symbol interference, etc., whereby this should in particular be possible for scrambled NRZ ("Non-Return-To-Zero") data. The bit error rate required by the individual data transmission standard in each case must in particular be maintained in data transfer over bandwidth-limited transmission channels. On the reception side, a precise detection of the flank change of the data signal must be guaranteed, with simultaneous reliable scanning of the data signal received, whereby strict requirements for jitter suppression are to be maintained during the scanning of the data signal received, and low inherent jitter is required.

The circuit arrangements for the data recovery within transceiver modules are designated as CDR ("Clock and Data Recovery") circuit arrangements. Hitherto CDR circuit arrangements designed in "mixed signal" circuit technology have predominantly been used, which feature both analogue as well as digital circuit components. With regard to the CDR circuit arrangements, a distinction can be drawn essentially between two basic concepts, which are designated "phase alignment" and "phase picking".

With the "phase alignment" concept, the scanning or sampling instant of the data signal received is adjusted with the aid of a phase regulating circuit to the middle of the bit cell received in each case (i.e. to the middle of the eye). For the recovery and synchronisation, in most cases flank-controlled D-flipflops are used, which, with the rising pulse flank, scan the data signal present at the individual flipflop input. This concept results in relatively high demands on the analogue circuit technology, in particular with regard to the inherent noise of the circuit components used. In addition to this, the data flow received must be relatively low in jitter, in order for the relatively slow-acting phase regulating circuit to be able to adjust the scanning or sampling instant precisely within the CDR circuit arrangement. A problem which arises in this situation is the optimum adjustment of the CDR circuit arrangement to the noise/jitter of the received data signal related to the band width of the CDR circuit arrangement.

With the "phase picking" concept, expressed simply, oversampling of the received signal is carried out (as a rule by a parallel connection of several D-flipflops which are timed by stepped scanning phases). For the data recovery a regulating circuit then selects the data output of that flipflop of which the scanning phase represents the optimum scanning instant, i.e. in the middle of the individual bit cell received in each case.

The two CDR concepts explained above are described, for example, in "A 155-MHz Clock Recovery Delay and Phase Locked Loop", Thomas Lee, IEEE JSSC, December 1992, pages 1736–1746 and in "A 30-MHz Hybrid Analog/Digital Clock Recovery in 2-μm CMOS", Paul R. Gray, IEEE JSSC, December 1990, pages 1385–1394.

Both concepts require a phase detector, which evaluates the phase position of the received data signal in relation to the scanning phase or in relation to the scanning phases of the CDR circuit arrangement. It is essentially digital processes which are used for this, since these are simpler to implement than analogue processes. A digital phase detector of this type can be abstracted as a flank-controlled circuit and switching arrangement, to which on the one hand the data signal is conducted and, on the other, a scanning phase, and which detects the phase position by means of internal state transitions.

As has already been explained, the received data signal is usually distorted and interfered with by a variety of unavoidable effects of the transmission channel, such as, for example, reflection, attenuation, channel cross-talk, and inter-symbol interference. With digital phase detectors, in which the received data signal takes effect directly on flank-sensitive data inputs, these interference factors lead as a rule to a false evaluation of the phase position. It is indeed possible, by very slow regulation, to suppress these false evaluations, provided they do not occur too frequently, sufficiently for them not to lead immediately to the unlocking of the phase regulation circuit. On the other hand, such a false evaluation of the phase position results in jitter even with slow regulation, so that, for the same bit error rate, a greater eye aperture of the received data signal is required than with a less interference-sensitive phase detector. A further disadvantage arises due to slow regulation in the longer transient period or locking time of the phase control circuit.

To avoid these disadvantages, the principle is known of obtaining the phase information not directly from the data signal, but to carry out an oversampling of the data signal, and to derive the phase position from the oversampled data signal. This is naturally usual with CDR circuit arrangements according to the "phase picking" concept. With such "phase picking" CDR circuit arrangements, there is no phase regulation in the traditional sense; instead, as has already been explained, from several data flows that data flow is selected of which the scanning phase is located as closely as possible to the optimum scanning or sampling instant in the middle of the individual bit cell, i.e. in the middle of the eye. For this selection decision, therefore, an intermediate storage of all the potential data flows is required, which disadvantageously increases the implementation effort and energy consumption.

The present invention is therefore based on the objective of providing a device for the recovery of data from a received data signal with which the problems referred to heretofore can be eliminated and, in particular, data recovery is possible even with the occurrence of interference or distortion in the received data signal with a low implementation effort and low energy consumption, and at the same time with low inherent jitter.

This objective is achieved according to the invention by means of a data recovery device with the features of claim 1. The sub-claims in each case define preferred and advantageous embodiments of the present invention.

The data recovery device according to the invention comprises a phase evaluation unit, for the best possible adjustment of the scanning phase of the received data signal, said unit carrying out a weighted phase evaluation. To this end, the phase evaluation unit comprises a scanning device, to which are conducted at least two different scanning phases as well as the received data signal, whereby the scanning device scans the data signal in a controlled manner through these scanning phases and, if necessary, regenerates it onto a digital logic level, and the digital scanning values acquired in this manner, regenerated if appropriate, of the individual scanning phases are made available at their outputs. In addition to this, the phase evaluation unit comprises a phase detector device which is connected to the outputs of the scanning device, and which evaluates the individual scanning values made available from the scanning device, in order thereby to determine whether signal changes in the received data signal are present within these scanning values, whereby the phase detector device derives, by means of this evaluation of the scanning values corresponding to the different scanning phases, intermediate signals which classify or characterise the phase error during the scanning of the received data signal in respect of its value and the direction of the deviation. Finally, the phase evaluation unit also comprises a filter device, to which are conducted the intermediate signals explained previously of the phase detector device, whereby the filter device is designed in such a way that it carries out a weighted filtering of the intermediate signals as a function of the individual class of the phase error, i.e. as a function of the individual intermediate signal of the phase detector device, and from this creates a placement or adjustment signal for the subsequent regulation of the location of the individual scanning phases of the scanning device in such a way that the phase error in relation to the received data signal is minimised.

By means of the present invention it is therefore possible to combine the advantages of the "phase alignment" concept with the advantages of the "phase picking" concept, and at the same time avoid the disadvantages of these two concepts. The phase evaluation unit according to the invention is based, in a similar manner to the "phase picking", on an oversampling of the received data signal, whereby, however, in contrast to the conventional "phase picking" concept, no phase selection decision is derived from the scanning values acquired in this manner, but, in a similar fashion to the "phase alignment" concept, adjustment information is derived which readjusts the phase position of the scanning in such a way that the phase error is minimised in respect of the data signal, and the regenerated data signal can, for example, be picked up at one or several flipflops. These flipflops, which are in principal constituent parts of the data recovery unit of the device according to the invention, can, but do not necessarily have to be, a part quantity of those flipflops which are a constituent part of the phase evaluation unit according to the invention. Overall, with an embodiment of this nature, a reduction is derived in the number of flipflops required, since a flipflop does not have to be provided for each conceivable phase position of the data signal. The phase evaluation unit proposed according to the invention can even function with a substantially reduced number of flipflops, since with larger phase errors a rougher temporal resolution can also be permitted. In this manner it is possible, with the aid of the present invention, to attain a minimisation of the implementation effort and the energy consumption.

Further advantages associated with the present invention are derived from the weighting and the filtering, which are possible, (as well as, if appropriate, also different quantisation) of the different phase error classes, i.e. for example, as a function of the amount and sign of the phase error, it is possible for different filtering, weighting, and/or quantisation of the corresponding intermediate signal to be carried out. If the coefficients of the weighting and the coefficients of the filter function are designed as variable, for example programmable, which can be realised in a simple manner particularly with a digital design, the behaviour of the phase regulation can be adapted in an optimum manner to the individual transmission channel and the specified jitter tolerances. Phase evaluation units known up to now are clearly less versatile in this respect than the phase evaluation unit according to the invention, since these conventional phase evaluation units do not form classes of phase errors, but essentially generate a linear pulse-width modulated signal representing the phase error, which is subjected to a single specified filter function. The present invention, by contrast, allows for an entirely different weighting (also non-linear and also with the extraction of particularly distorted time sections), as well as an entirely different dynamic of the phase evaluation, depending on the individual class of the phase error.

From a measurement of the properties of the individual transmission channel, the optimum filter and weighting coefficients can be derived. To this end, suitable algorithms can be used for the determination of the optimum coefficients in each case, whereby, until the development of suitable algorithms, as a rule a restriction to a few coefficient sets is sufficient, which are derived empirically on the basis of examinations of the bit error rates of a given transmission channel.

Another substantial difference to the known prior art lies in the fact that the phase evaluation unit according to the invention initially scans the digital reception signal via the scanning device before it passes to the phase detector device, i.e. the received data signal is already temporally quantised, so that the phase error identified from this is likewise necessarily quantised as a function of the number of the different scanning phases of the scanning device. In this context, in principle, one of the numbers of the different scanning phases of the scanning device can differ from the corresponding number of phase positions. Although in principle operation with only two different scanning phases is conceivable, in practice clearly more than two different scanning phases are used for preference for the oversampling of the received data signal, in order thereby to obtain an adequately fine resolution of the quantised phase signal.

Another advantage associated with the present invention lies in the fact that the phase detector device provided for after the oversampling of the received data signal is substantially uncritical with regard to run time differences, since the precision is essentially determined by the oversampling of the data signal. Accordingly, different digital error correction processes can be used in the phase detection, such as are used, for example, as what are referred to as bubble error correction processes in rapid analogue/digital converters. By suitable design of the logic links inside the phase detector device, it is possible for short high-frequency faults in the data signal to be largely suppressed, which affect only a part of the pulse period but which, in a conventional flank-controlled phase detector, would lead to an erroneous decision.

Overall, therefore, a device is proposed for pulse and data recovery with weighted phase evaluation, which scans the weighted phase evaluation in each around the area of an anticipated signal change, and derives from the scanned data signal phase error information, whereby a division of the phase error into classes is effected, which in each case can be subjected to different temporal quantisations, weightings, and filter functions, so that overall a minimisation of the implementation effort and of the energy consumption can be derived, with, at the same time, the greatest possible flexibility of the device.

The present invention is suitable for preference for use in the reception signal path of a transceiver module for wire-bound data transfer, but without being restricted to this preferred area of application.

The invention is described in greater detail hereinafter by reference to the appended drawings, on the basis of preferred embodiments.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIG. 3 shows a representation for the clarification of an oversampling of a received data signal carried out in accordance with FIG. 1 and FIG. 2;

FIG. 4 shows a substantially simplified schematic representation of a sampling device and phase detector device represented in FIG. 1 and FIG. 2;

FIG. 5 shows an example of digital realisation of the scanning device, and

Figure 1:
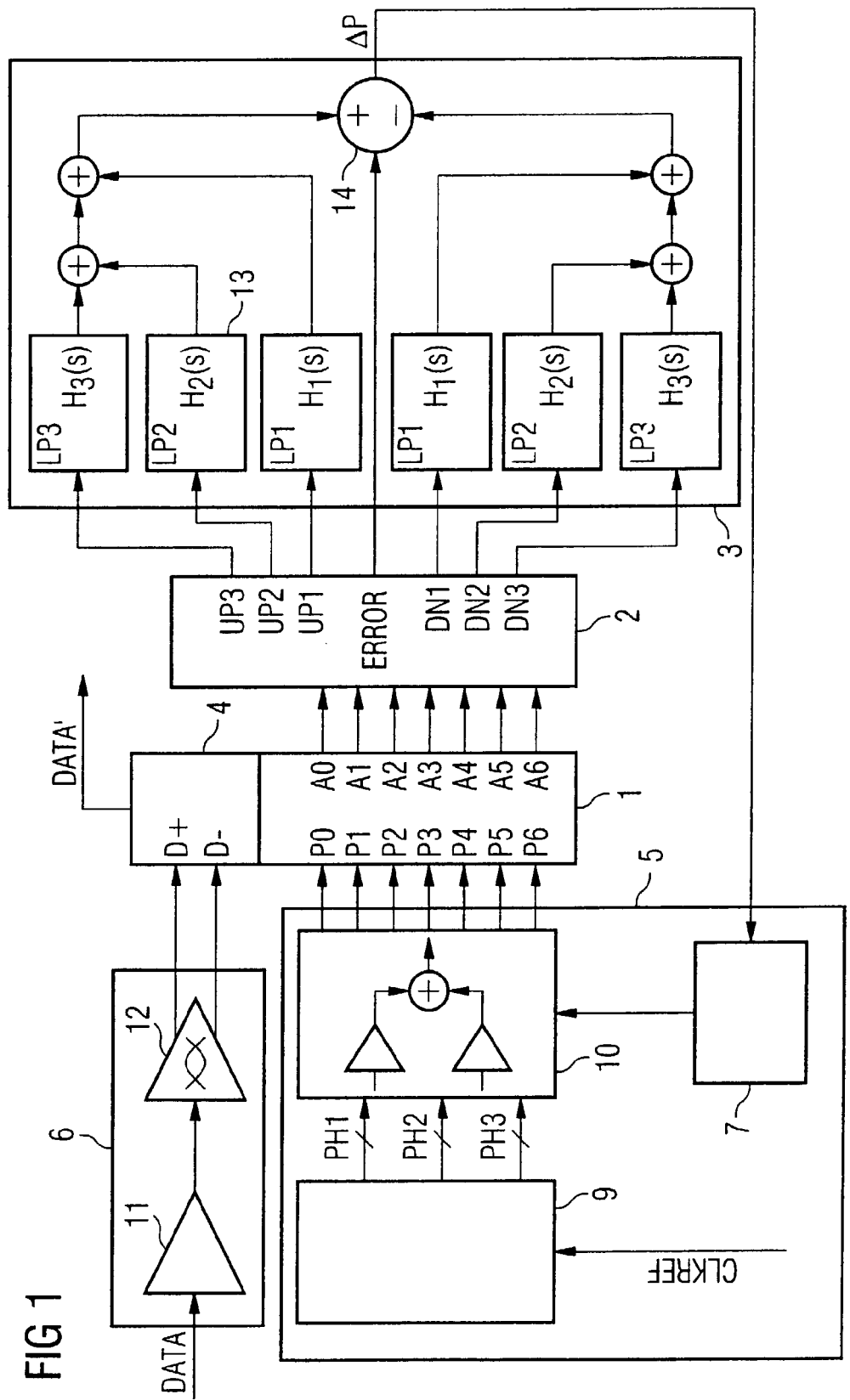
FIG. 1 shows a simplified block circuit diagram of a data recovery device according to a first embodiment of the present invention.

With the CDR circuit arrangement shown in FIG. 1, a received data signal DATA is processed in the first instance by a device 6, which is usually effected by time-continuous amplifiers 11, limiters, equalizers, or filters 12, etc., before it is subjected to the actual pulse and data recovery. The data signal prepared in this manner is conducted in the form of its differential part signals D+ and D− to a data recovery unit 4, which regenerates or recovers the data originally sent by scanning the received and processed data signal, whereby the regenerated data is designated by DATA' in FIG. 1. To determine the suitable scanning phase of the data recovery unit 4, a phase evaluation unit is provided, which comprises a scanning device 1, a phase detector device 2, and a filter device 3.

Conducted to the scanning device 1 are several scanning and pulse phases P0–P6, which are generated by a scanning phase generating device 5. This scanning phase generating device 5 comprises a phase regulating circuit ("Phase Locked Loop", PLL), or a delay regulating circuit ("Delay Locked Loop", DLL) 9, downstream of which are connected a phase interpolator for the interpolation of the phase information PH1–PH3 provided by the phase or delay regulating circuit 9. The phase or delay regulating circuit 9 is operated by a reference pulse CLKREF. The phase position is selected by a setting signal $\Delta P$, which in the embodiment shown in FIG. 1 is conducted to the phase interpolator 10 via a current/voltage converter 7.

The scanning device 1 receives, in addition to the scanning phases P0–P6, also the processed data signal in the form of its differential part signals D+, D−. The scanning device 1 scans the received data signal in a controlled manner through the scanning phases P0–P6, and, if necessary, regenerates the scanning values thus obtained to a digital logic level, whereby the digital scanning values A0–A6 thus scanned and regenerated, are made available via corresponding outputs of the phase detector device 2.

The phase detector device 2 is connected on the input side to the outputs of the scanning device 1 and therefore receives the scanning values A0–A6 of the received data signal which correspond to the individual scanning phases P0–P6. The phase detector device 2 determines, by the evaluation of these scanning values A0–A6, whether signal changes in the received data signal occur between these scanning values, and derives from this intermediate signals UP1–UP3, DN1–DN3, ERROR, which classify the phase error present during the scanning of the received data signal both in terms of the amount and also with regard to the direction of the phase deviation.

The intermediate signals which are generated in this manner in the phase detector device 2 are conducted to the filter device 3, which filters and weights these intermediate signals on the basis of the individual class of the phase error, and generates from this the setting signal $\Delta P$ for the scanning phase generation direction 5, whereby this setting signal $\Delta P$ is suitable for regulating subsequently the position of the scanning phases P0–P6 in relation to the received data signal in such a manner that the phase error is minimised in relation to the received data signal.

DETAILED DESCRIPTION OF THE EXEMPLARY EMBODIMENTS

With the embodiment shown in FIG. 1, the filter device 3 is designed as a time-continuous analogue filter; i.e. the setting signal $\Delta P$ generated by the filter device 3 is of an analogue nature. For the individual intermediate signals UP1–UP3 and DN1–DN3 of the phase detector device 2, separate analogue filters 13 are provided in each case in the form of low-pass filters LP1–LP3 with transmission functions $H_1(s)$–$H_3(s)$. The transmission functions of the individual low-pass filters can be represented as follows:

$$H_1(s) = \frac{K_1}{T_1 \cdot s + 1}$$

Here, $K_1$ designates the individual transmission factor and $T_1$ the individual time constant. The intermediate signals UP1–UP3 and DN1–DN3 of the phase detector device 2 classify the phase error of the scanning device 1 in terms of amount as well as with regard to the direction of the phase deviation. The intermediate signals UPi and DNi designate for preference the same phase error, but with different signs. From FIG. 1 it can be seen that for UP1 and DN1, UP2 and DN2, and UP3 and DN3, for preference low-pass filters 3 are provided in each case with the same transmission function. The output signals of the individual filters 13 are added in a weighted manner with the help of adders 14, so that a setting signal ΔP is output on the output side.

Figure 2:
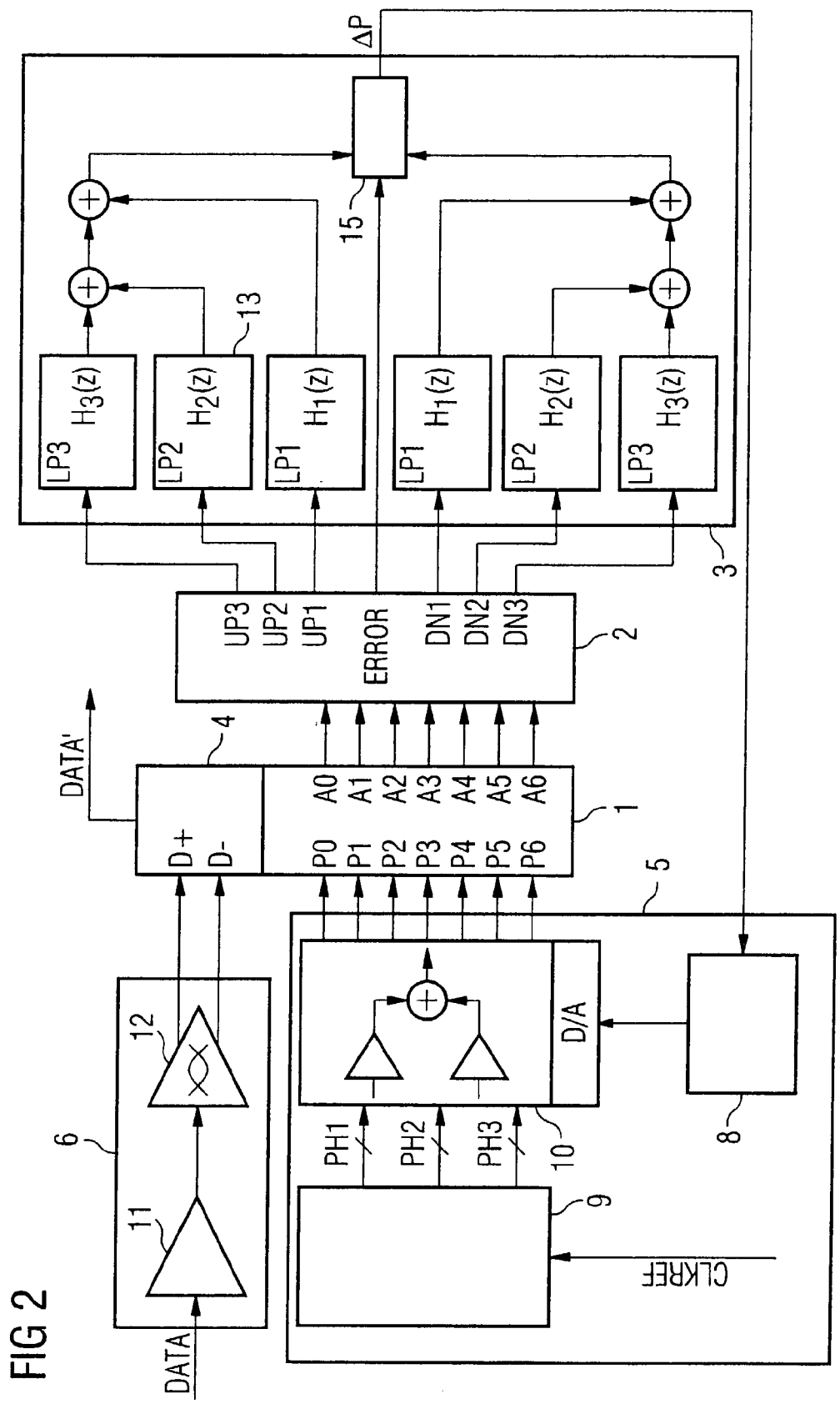
FIG. 2 shows a simplified block circuit diagram of a data recovery device according to a second embodiment of the present invention.

With the embodiment shown in FIG. 2, the filter device 3 is designed as digital with transmission functions $H_1(z)$–$H_3(z)$, i.e. the setting signal ΔP generated by the filter device 3 is a digital value and in the embodiment represented is generated by an upwards/downwards counter 15. The digital setting signal ΔP is therefore the counter state of the upwards/downwards counter 15. Digital counters are excellently well-suited for the integration of the phase information, without any drift occurring if the data flow does not feature any signal change over an extended period. Even any deviations in the transmission and reception frequency can be corrected in a robust manner in such digital designs by regular increase or reduction of the counter state. In most practical cases, therefore, the embodiment shown in FIG. 2 is preferred. According to FIG. 2, the digital setting signal ΔP is conducted to an interpolator control unit 8, of which the output signal controls the phase interpolator 10 via a digital/analogue converter.

The basic function of the phase detector device 2 is explained in the following by reference to FIG. 3.

In FIG. 3 the two differential part signals D+, D− of the received and processed signal DATA are shown, whereby a signal change occurs within the signal section shown in FIG. 3. As has already been explained, the data signal is scanned by the scanning device 1 with the different scanning phases P0–P6. These scanning phases, as in the example shown in FIG. 3, do not necessarily have to be equidistant. A large phase error can also be subjected to a rougher quantisation than a small phase error, without substantial loss of quality. In this manner fewer scanning phases have to be produced, and fewer scans carried out than with equidistant scanning, which accordingly reduces the realisation effort and power consumption.

The phase detector device 2 can obtain the phase error information by a logical comparison (for example, with the aid of a logic XOR link) of the corresponding sequential scanning values A0–A6. If the signal change of the data signal is located between the scanning phases P0 and P1, for example, then the result of this logic comparison with the aid of an XOR link would be "true", and all other links of adjacent scanning phases would be "untrue". If all possible signal changes between the scanning phases P0 and P6 are entered in a table, on the assumption that a maximum of one signal change and no fault occurs, then the following bit pattern is derived for the corresponding scanning values A0–A6:

0000000
1000000
1100000
1110000
1111000
1111100
1111110
1111111
0111111
0011111
0001111
0000111
0000011
0000001

A phase error can be allocated to each of these bit patterns, whereby the phase error for the bit patterns 0000000 and 1111111 are unknown, since these bit patterns do not designate a signal change. If it is further assumed that the ideal position for the signal change were to be at the scanning phase P3, the following classes of phase errors can, for example, be formed:

DN3={1000000, 0111111}
DN2={1100000, 0011111}
DN1={1110000, 0001111}
UP1={1111000, 0000111}
UP2={1111100, 0000011}
UP3={1111110, 0000001}

The classes DN3, UP3 in this situation represent in each case the largest phase error, while the classes DN1 and UP1 in each case represent the smallest phase error. The signals UPi and DNi relate in each case to the absolute position of the phase error in relation to the scanning phase P3, whereby, with a phase error of the class UPi, the scanning phases must be advanced and with a phase error of class DNi they must be set back. Setting the scanning phases back corresponds, in accordance with FIG. 3, a displacement of the scanning phases in the direction of the arrow to the right, while advancing the scanning phases in accordance with FIG. 3 corresponds to a displacement of the scanning phases to the left. Naturally, any other desires coding of the phase error classes is also possible.

The idealised example explained above makes it clear how the phase detector device 2 can evaluate and classify the phase position, if no faults are present. By contrast, if faults are present, it could lead to erroneous evaluations of the phase position and of the phase error.

It should be noted in this context, however, that the bit patterns explained previously relate to what is referred to as a folded thermometer code, such as occurs in the z is comparator bank of folding analogue/digital converters. If there were no signal inversion, this would be a conventional thermometer code, such as occurs in flash-analogue/digital converters. There are a large number of known processes for such thermometer codes, which can correct errors arising within such codes, such errors being mostly designated in the literature as "bubble errors". In this situation, as a rule, combinatory circuits are used, which evaluate three or more adjacent bits of a bit pattern in order to identify reliably a signal change even in the event of defective, i.e. disturbed, bit patterns. Within the framework of the present invention, such known processes can be used for the correction of defective bit patterns. If, for example, as a result of faults, the bit pattern 1010000 were to occur, it would be possible, with this error correction process, for the "bubble" to be determined on the second bit from the left and for it initially to be displaced to the left before a further decoding. Accordingly, as a result of this error correction, the corrected bit pattern 1100000 arises, which can subsequently be allocated to the phase error class DN2. In very distorted bit patterns, for example the bit pattern 1010100, by contrast, it is recommended that a phase detection be waived on the basis of this bit pattern, and, instead, an error signal can be issued, which is designated in the drawing by ERROR.

On the basis of the above description, it is undoubtedly possible for the person skilled in the art to derive optimum combinatorial functions for the individual application, for the realisation of the phase detector device.

In FIG. 4, again highly simplified, the interaction of the scanning device 1 and the phase detector device 2 is represented.

FIG. 5 shows, by way of example, a digital realisation of the scanning device 1, whereby the received data signal is conducted to a plurality of D-flipflops 16, at their data or D-inputs, while the different scanning phases P0–P6 are imposed at the pulse or clock inputs. The data or Q-outputs of these D-flipflops 16 form the outputs of the scanning device 1, and provide the corresponding scanning values A0–A6. By means of a reset signal RESET, the individual D-flipflops 16 are cancelled and reset. As an equivalent to very finely stepped scanning phases, it is possible with a technical circuit realisation for run times also to be utilised on pulse and data lines in order to reduce the number of clock or scanning phases required, although this is not possible in any scope desired, since these run times are not as a rule tuneable.

Figure 6:
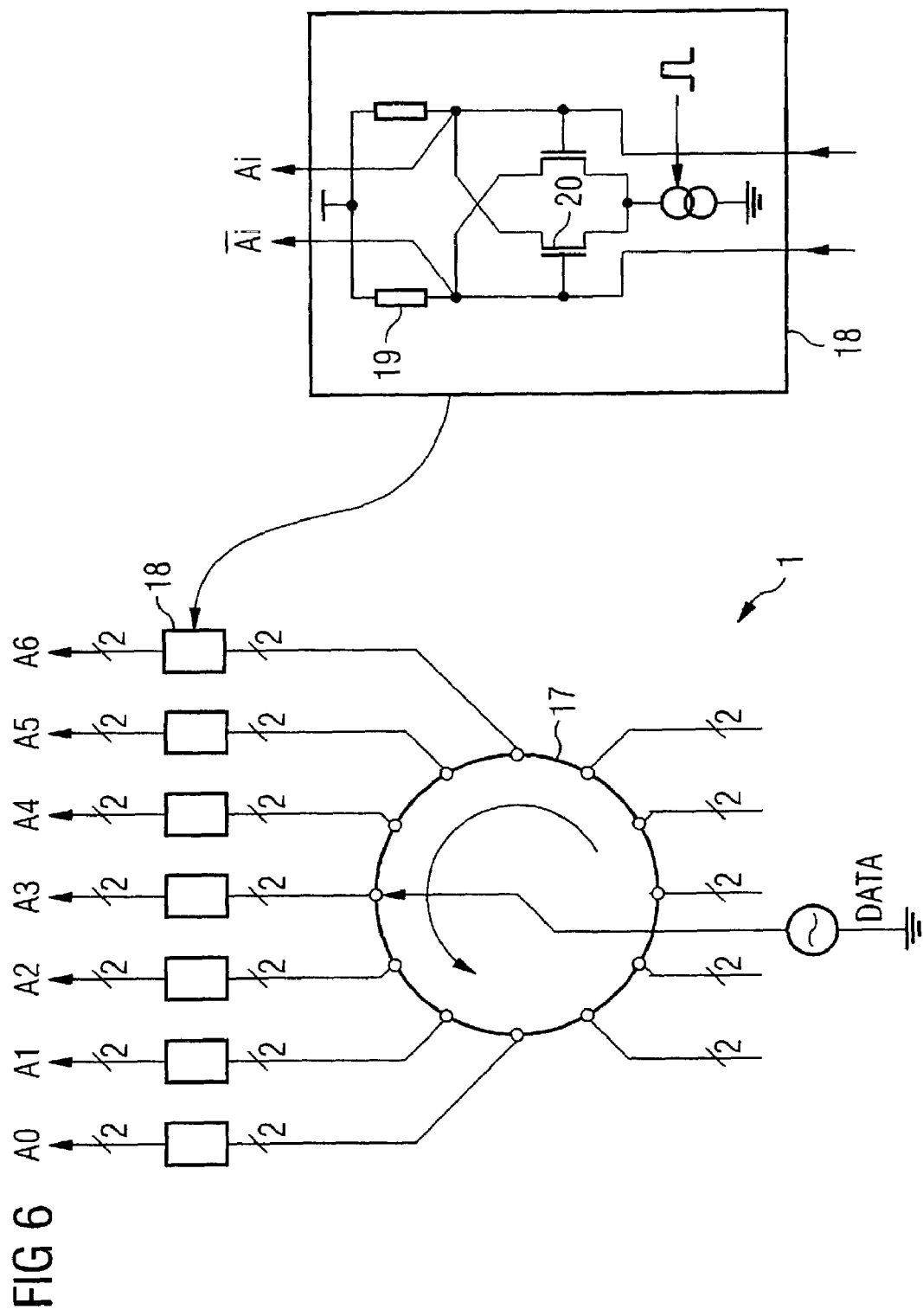
FIG. 6 shows an example of analogue realisation of the scanning device.

FIG. 6 shows by way of example an analogue realisation of the scanning device 1, whereby in this case the scanning device 1 exercises the function of an electronic commutator 17, which conducts the received data signal DATA (which is also represented in FIG. 6 in the form of a corresponding signal source) temporally in sequence via regenerative latch circuits 18 to the individual outputs of the scanning device 1 (the lower signal outputs represented in FIG. 6 of this electronic commutator 17 are not of significance in the embodiment shown for the determination of the phase error information). Each regenerative latch circuit 18 can, for example, feature the circuit set-up represented in FIG. 6 with symmetrically connected resistors 19 and transistors 20. Immediately after each of the individual regenerative latch circuits 18 has been separated from the data signal DATA again, the regenerative latch circuit 18 is pulsed, and the scanning values conducted to this regenerative latch circuit are accordingly regenerated at the differential outputs on the full digital signal stroke. Such a formation of the scanning device 1 is particularly advantageous if the received data signal cannot be amplified to the full digital signal stroke before scanning. As represented in FIG. 6 on the basis of the regenerative latch circuit 18, the structure of the scanning device is fully differential in accordance with the differential part signals D+, D− of the received data signal.

For the actual data recovery, the data recovery unit 4 of the CDR circuit arrangement shown in FIG. 1 or FIG. 2 can scan the received and processed data signal with one of the scanning phases P0–P6, subsequently regulated by the phase evaluation unit, which comprises the scanning device 1, the phase detector device 2, the filter device 3, and the scanning phase generating device 5. It is not necessary, however, for the received data signal to be scanned precisely by the data recovery unit 4 with these scanning phases; i.e. it is not required for one of the outputs of the scanning device 1 to conduct the synchronised and recovered data signal. In fact, it is sufficient if, in the scanning device 1, only scanning instants are realised around the time of the anticipated signal change, while the scanning instant(s) for the recovery of the data signal related to the individual instant of the signal change, or related to the ideal scanning phase P3 in the ideal case is to be temporally delayed by half a pulse period. It is precisely with communications systems with larger horizontal eye apertures that it would be a waste of energy for the centre of the eye to be scanned temporally with extremely fine quantisation, which in this case would undoubtedly not allow for any information to be obtained about the phase position. The "phase picking" CDR circuit arrangements known hitherto and based on oversampling must, however, by the very nature of the principle involved, do just that, because their sampling lattice simultaneously specifies the finest possible quantisation of the phase signal. From this there follows the superiority of the present invention in respect of implementation effort and energy consumption in comparison with previously-known CDR circuit arrangements.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by the United States Letters Patent is:

1. A phase evaluation device for use in data recovery, comprising:
   a scanning device for scanning the received data signal in accordance with several different scanning phases in order to generate a corresponding number of scanning values of the data signal;
   a phase detector device for the evaluation of scanning values generated by said scanning device in order to derive intermediate signals which classify a phase error in the scanning of the data signal by the scanning device; and
   a filter device for the weighted filtering of the intermediate signals of the phase detector device as a function of different classes of the phase error in order to generate a setting signal for a subsequent regulation of the scanning phases of the scanning device.

2. A device according to claim 1, further comprising a scanning phase generating device, said scanning phase generating device being capable of receiving the setting signal from the filter device and generating the different scanning phases for the scanning device.

3. A device according to claim 2, wherein the scanning phase generating device comprises a phase or delay control circuit with a downstream phase interpolator, and wherein the phase interpolator is actuated as a function of the setting signal of the filter device.

4. A device according to claim 1, wherein the phase detector device is capable of correcting errors in the scanning values of the scanning device for the suppression of influences of interference or errors in the data signal.

5. A device according to claim 4, wherein the phase detector device will generate an error signal upon determining that scanning values from the scanning device have interference above a specified degree.

6. A device according to claim 1, wherein the phase detector device evaluates a bit pattern from the scanning values corresponding to the different scanning phases from the scanning device, in order to determine the corresponding class of the phase error, and to generate a corresponding intermediate signal.

7. A device according to claim 1, wherein the filter device is time-continuous and generates an analog setting signal.

8. A device according to claim 1, wherein the filter device is digital and generates a digital setting signal.

9. A device according to claim 8, wherein the filter device comprises a digital counter, and wherein the digital setting signal corresponds to the counter status of the digital counter.

10. A device according to claim 1, wherein the intermediate signals generated by the phase detector device correspond in each case to a different class of phase error, and wherein the filter device comprises mutually independent filter and weighting functions for each of the individual intermediate signals of the phase detector device.

11. A device according to claim 10, wherein coefficients of the individual filter and weighting functions of the filter device are capable of being changed.

12. A device according to claim 10, wherein the filter device quantises the individual intermediate signals of the phase detector device in each case independently of one another.

13. A device according to claim 1, wherein the filter device subjects the individual intermediate signals of the phase detector device to a weighted low-pass filtering process.

14. A device according to claim 1, wherein the scanning phases of the scanning device are not equidistant.

15. A device for data recovery according to claim 1, wherein the scanning device scans the received data signal in accordance with the several different scanning phases in each case in the area of the instant of an anticipated signal change in the received data signal.

16. A device according to claim 1, wherein the scanning device is digital in design and comprises multiple flipflops, to which the received data signal is conducted to a data input in each case, such that in each case a different scanning phase from the multiple different scanning phases is conducted to the individual flipflops at a clock input, so that at data outputs of the individual flipflops the scanning values of the received data signal is output corresponding to the different scanning phases.

17. A device according to claim 1, wherein the scanning device distributes the received data signal in temporal sequence according to the different scanning phases to corresponding output connections of the scanning device.

18. A device according to claim 17, wherein the scanning device distributes the received data signal in temporal sequence in each case via regenerative latch circuits to the output connections of the scanning device.

19. A data recovery device, comprising:
a data recovery unit for the recovery of data contained in a received data signal by scanning the received data signal, and
a phase evaluation device which comprises
a scanning device for scanning the received data signal in accordance with several different scanning phases in order to generate a corresponding number of scanning values of the data signal;
a phase detector device for the evaluation of scanning values generated by said scanning device in order to derive intermediate signals which classify a phase error in the scanning of the data signal by the scanning device; and
a filter device for the weighted filtering of the intermediate signals of the phase detector device as a function of different classes of the phase error in order to generate a setting signal for a subsequent regulation of the scanning phases of the scanning device.

20. A device according to claim 19, wherein the data recovery unit generates the recovered data by scanning the received data signal by a half clock period in relation to the instant of an anticipated signal change.

21. A device according to claim 19, further comprising: a reception unit for the reception of a data signal transmitted over a transmission path; and a transmitting unit for transmitting a data signal over said transmission path after subjecting said data signal to phase evaluation.

* * * * *